United States Patent [19]

Hause

[11] Patent Number: 5,436,197
[45] Date of Patent: Jul. 25, 1995

[54] METHOD OF MANUFACTURING A BONDING PAD STRUCTURE

[75] Inventor: James V. Hause, Phoenix, Ariz.

[73] Assignee: Motorola, Inc., Schaumburg, Ill.

[21] Appl. No.: 116,639

[22] Filed: Sep. 7, 1993

[51] Int. Cl.6 ............................................. H01L 21/44
[52] U.S. Cl. ........................................ 437/183; 437/195;
        437/205; 437/215; 437/8; 257/723; 257/786
[58] Field of Search ............... 437/183, 195, 205, 215,
        437/8; 257/723, 786

[56] References Cited

U.S. PATENT DOCUMENTS

| | | | |
|---|---|---|---|
| 4,026,008 | 5/1977 | Drees | 437/8 |
| 4,195,195 | 3/1980 | de Miranda et al. | 257/786 |
| 4,586,242 | 5/1986 | Harrison | 437/8 |
| 4,801,561 | 1/1989 | Sankhagowit | 437/8 |
| 4,875,138 | 10/1989 | Cusack | 257/786 |
| 4,974,053 | 11/1990 | Kinoshita et al. | 257/786 |
| 4,990,996 | 2/1991 | Kumar | 257/786 |
| 5,002,895 | 3/1991 | LeParquier et al. | 437/8 |
| 5,008,614 | 4/1991 | Shreeve et al. | 437/8 |
| 5,057,452 | 10/1991 | Theunissen et al. | 437/89 |
| 5,066,831 | 11/1991 | Spielberger et al. | 257/786 |
| 5,153,507 | 10/1992 | Fong et al. | 257/786 |
| 5,157,476 | 10/1992 | Yoshida | 257/786 |

Primary Examiner—Olik Chaudhuri
Assistant Examiner—Long Pham
Attorney, Agent, or Firm—Rennie William Dover

[57] ABSTRACT

A test card (10) or a semiconductor die (150) having bonding pads (41–43, 180–182) for testing semiconductor devices, and a method for making the bonding pads (41–43, 180–182) are shown. The test card (10) or the semiconductor die (150) is partitioned into a plurality of bonding pad regions (14–17 and 170–173). Bonding pads (41–43, 180–182) are formed in the respective bonding pad regions (14–17 and 170–173). The bonding pad regions (14–17 and 170–173) and the bonding pads (41–43, 180–182) are formed by patterning a layer of conductive material (16, 167) on a major surface (12) of the test card (10) or on the semiconductor die (150).

9 Claims, 6 Drawing Sheets

METHOD OF MANUFACTURING A BONDING PAD STRUCTURE

BACKGROUND OF THE INVENTION

This invention relates, in general, to interconnect structures, and more particularly, to bonding pad structures and a method of making bonding pad structures.

An important aspect in the design and manufacture of semiconductor devices is transmitting electrical signals to and from the semiconductor devices. In particular, methods and means of testing semiconductor devices to ensure compliance with design and customer specifications has become a critical issue. In addition, tests have been designed for monitoring semiconductor device and manufacturing processes, and for evaluating the physical characteristics and limitations of semiconductor substrate materials. For example, thermal test chips have been used to monitor the temperature at various locations on semiconductor die to determine thermal limitations of the semiconductor material.

A common approach to testing a semiconductor device fabricated in a semiconductor die is to bond it to a test card designed to couple an electrical signal source to a semiconductor device. Typically, bonding pads are formed at discrete locations on the test card and bumps are subsequently formed on these bonding pads. The test card bonding pads, and hence the bumps, are positioned to mate with bonding pads on the semiconductor die. The test card and the semiconductor die are bonded together and the semiconductor device is then tested. A drawback to this technique is that changes in the locations of semiconductor device bonding pads requires fabricating new test cards having bonding pads positioned to mate with those of the semiconductor device.

Accordingly, it would be advantageous to have a bonding pad structure on a test card or a semiconductor substrate having a semiconductor device and a method of making the bonding pad structure, wherein the bonding pad structure has a plurality of configurations.

SUMMARY OF THE INVENTION

Briefly stated the present invention is a bonding pad structure comprising a substrate having a major surface and a plurality of bonding pad regions. A plurality of bonding pads are formed in each of the plurality of bonding pad regions, at least two of the plurality of bonding pads in one of the plurality of bonding pad regions having different sizes. An electrical interconnect couples at least one of the bonding pads in the first of the plurality of bonding pad regions with at least one of the bonding pads in a second of the plurality of bonding pad regions.

Another aspect of the present invention is a method of manufacturing a bonding pad structure comprising providing a substrate having a major surface. Subsequently the method entails forming a plurality of bonding pad regions on the major surface and forming a plurality of bonding pads in each of the plurality of bonding pad regions, wherein each bonding pad of the plurality of bonding pads in one of the plurality of bonding pad regions has a different size, and at least two of the plurality of bonding pads are interconnected.

DETAILED DESCRIPTION OF THE DRAWINGS

Figure 1:
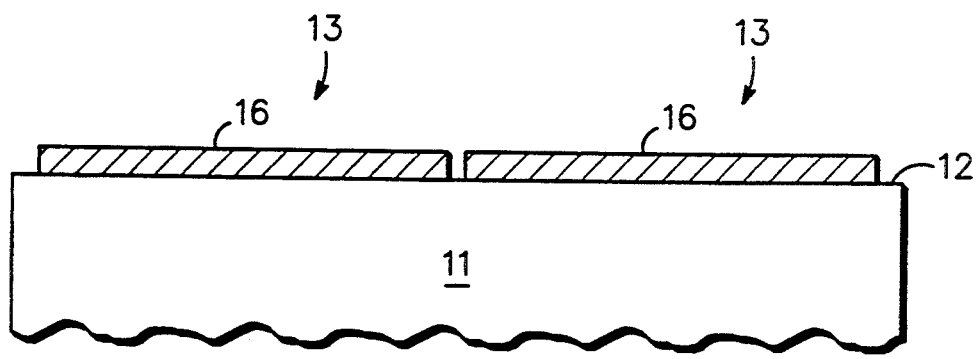
FIG. 1 illustrates a cross-sectional view of a portion of a test card taken along section line 1—1 of FIG. 2 in accordance with a first embodiment of the present invention.
Figure 2:
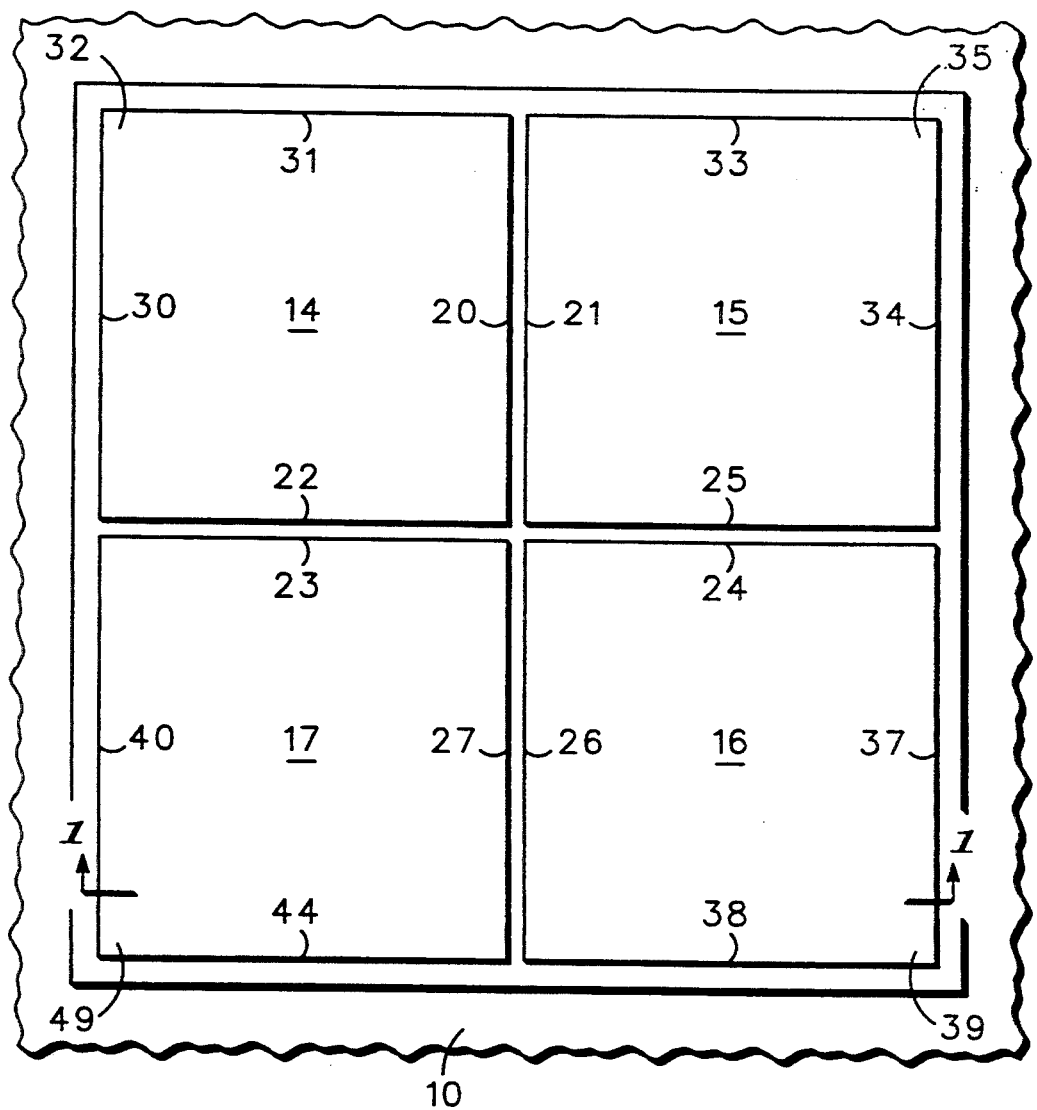
FIGS. 2-3 illustrate a plan view of a portion of a test card in progressive steps of manufacture in accordance with the first embodiment of the present invention.

FIG. 1 illustrates a cross-sectional view of a portion of a test card 10 taken along section line 1—1 of FIG. 2 in accordance with a first embodiment of the present invention. The test card 10 is used to transmit electrical signals to and from a semiconductor device (not shown) that is being tested. The test card 10, also referred to as an interconnect structure for testing semiconductor devices, is comprised of a support substrate 11 having a major or principal surface 12. The material for the support substrate 11 is selected in accordance with the thermal and electrical properties of the semiconductor device being tested and may include semiconductor substrate materials such as, for example, gallium arsenide, silicon, germanium, or the like. In addition, the support substrate 11 may be manufactured from dielectric materials such as, for example, silicon dioxide, silicon nitride, a bismaleimide triazine resin, or the like. In one embodiment, the support substrate 11 is gallium arsenide.

A plurality of bonding pad regions 13 are formed on the major surface 12. The bonding pad regions 13 are also referred to as conductive pad regions and are spaced apart from each other. By way of example, the bonding pad regions 13 are formed by depositing a layer of conductive material 16 such as gold, aluminum, titanium-tungsten, or the like, on the major surface 12. Subsequently, photolithographic techniques are used to pattern the layer of conductive material 16, thereby forming the plurality of bonding pad regions 13. Methods of patterning a layer of conductive material to form bonding pad regions are well known to those skilled in the art.

FIG. 2 is a plan view of a portion of the test card 10 in a step of its manufacture. The test card 10 is partitioned into four square-shaped bonding pad regions 14, 15, 16, and 17, each bonding pad region having four sides. The bonding pad region 14 has a side 20 adjacent and parallel to a side 21 of the bonding pad region 15, and a side 22 adjacent and parallel to a side 23 of the bonding pad region 17. The bonding pad region 16 has a side 24 and a side 26, wherein the side 24 is adjacent and parallel to a side 25 of the bonding pad region 15, and the side 26 is adjacent and parallel to a side 27 of the bonding pad region 17.

In addition, the bonding pad region 14 has two outer sides 30 and 31 that intersect at a substantially right angle to form a corner 32. Likewise, bonding pad regions 15, 16, and 17 each have outer sides that intersect at substantially right angles to form corners. In particular, the bonding pad region 15 has two outer sides 33 and 34 that intersect to form a corner 35, bonding pad region 16 has two outer sides 37 and 38 that intersect to form a corner 39, and bonding pad region 17 has two outer sides 40 and 44 that intersect to form a corner 49. By way of example, the sides of the bonding pad regions 14, 15, 16, and 17 each have a length of approximately 700 micrometers ($\mu$m) and adjacent sides (i.e., the sides 20 and 21, the sides 22 and 23, the sides 24 and 25, and the sides 26 and 27) are separated by a distance of approximately 13 $\mu$m.

Figure 3:
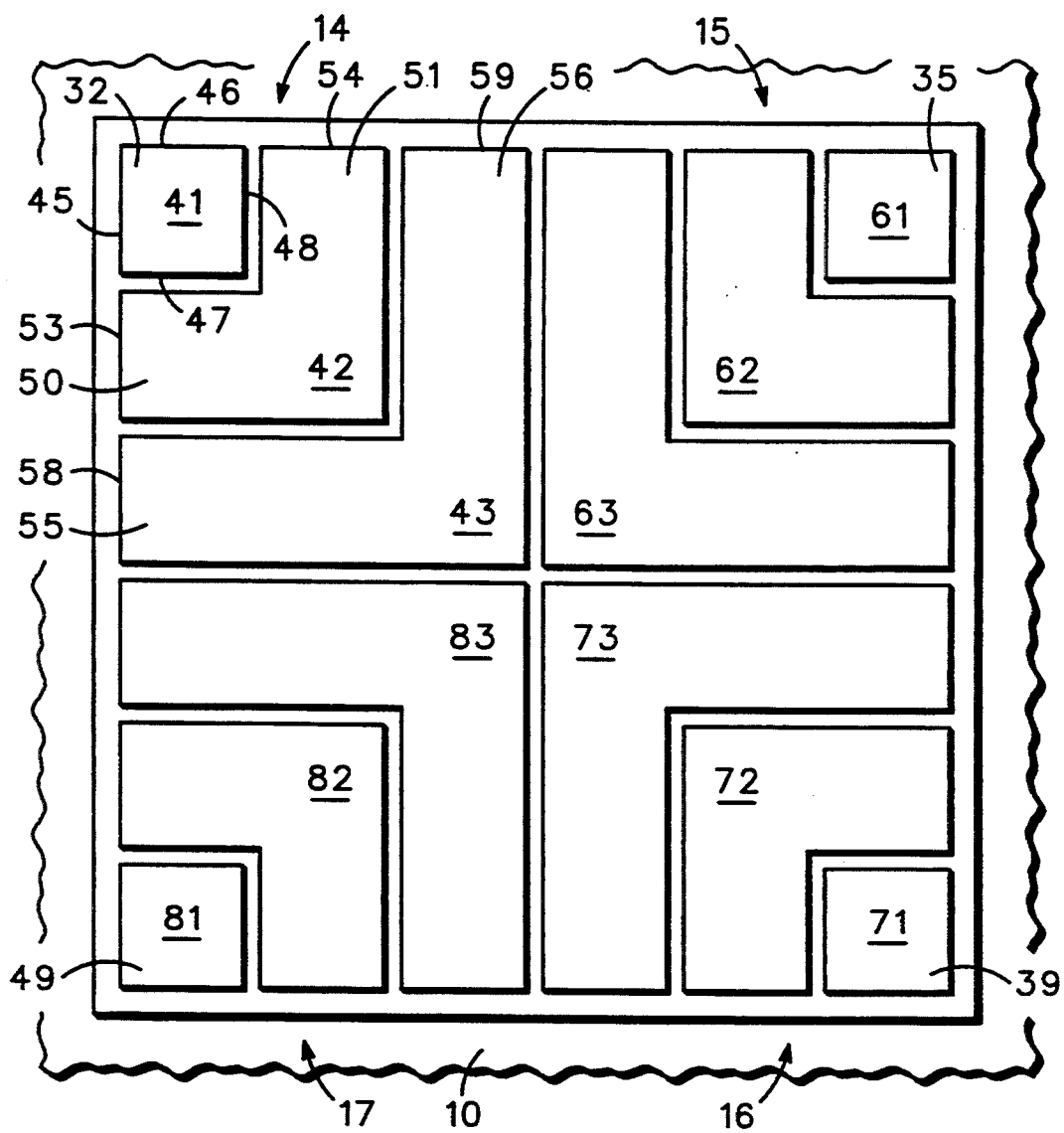

Referring now to FIG. 3, a plurality of bonding pads are formed in each bonding pad region 14, 15, 16, and 17. The bonding pads are also referred to as conductive pads. In the embodiment shown in FIG. 3, each bonding pad region 14, 15, 16, and 17 has one square shaped bonding pad and two substantially L-shaped bonding pads. In particular, a square shaped bonding pad 41, and L-shaped bonding pads 42 and 43 are formed in the bonding pad region 14. The square shaped bonding pad 41 is formed from the corner 32, and has a first side 45, a second side 46, a third side 47, and a fourth side 48. The first side 45 is formed from a portion of the outer side 30 (FIG. 2) and the second side 46 is formed from a portion of the outer side 31 (FIG. 2). In accordance with the previously cited example, the sides 45, 46, 47, and 48 of square shaped bonding pad region 41 have a length of approximately 102 $\mu$m. Thus, the bonding pads 41, 42, and 43 within bonding pad region 14 are electrically isolated from each other.

The first L-shaped bonding pad 42 has a first leg 50 having an end 53, and a second leg 51 having an end 54, wherein the first leg 50 is parallel to and spaced apart from the third side 47, and the second leg 51 is parallel to and spaced apart from the fourth side 48. In other words, the shape of the first L-shaped bonding pad 42 conforms to the shape of the third and fourth sides 47 and 48, respectively. The first end 53 is formed from a portion of the outer side 30 (FIG. 2) and the second end 54 is formed from a portion of the outer side 31 (FIG. 2). In the embodiment shown in FIG. 3, the length of the outer side 30 that forms the first end 53 and the length of the outer side 31 that forms the second end 54 are substantially the same as the lengths of the sides 45, 46, 47, and 48. In accordance with the previously cited example, a length of the outer sides 30 and 31 (FIG. 2) of approximately 102 $\mu$m is used to form the ends 53 and 54, respectively. The first leg 50 is spaced apart from the third side 47 by approximately 13 $\mu$m, and the second leg 51 is spaced apart from the fourth side 48 by approximately 13 $\mu$m. In other words, there is a gap in outer sides 30 and 31 between the square shaped bonding pad 41 and the first L-shaped bonding pad 42 of approximately 13 $\mu$m.

The second L-shaped bonding pad 43 has a first leg 55 having an end 58, and a second leg 56 having an end 59, wherein the first leg 55 is parallel to and spaced apart from the first leg 50 of the first L-shaped bonding pad 42, and the second leg 56 is parallel to and spaced apart from the second leg 51 of the first L-shaped bonding pad 42. The second L-shaped bonding pad 43 is formed such that the first legs 50 and 55 of the L-shaped bonding pads 42 and 43, respectively, are parallel to each other. Likewise, the second legs 51 and 56 are parallel to each other.

As is obvious to those skilled in the art, the shape of the second L-shaped bonding pad 43 conforms to the shape of the first L-shaped bonding pad 42 in the embodiment illustrated in FIG. 3. Like ends 53 and 54, the first end 58 is formed from a portion of the outer side 30 (FIG. 2) and the second end 59 is formed from a portion of the outer side 31 (FIG. 2), respectively. Preferably, the length of the outer side 30 that forms the first end 58 and the length of the outer side 31 that forms the second end 59 are substantially the same as the lengths of the sides 45, 46, 47, and 48. In accordance with the previously cited example, a length of the outer sides 30 and 31 of approximately 102 $\mu$m is used to form the ends 58 and 59, respectively, and the first legs 50 and 55 are separated from each other by a distance of approximately 13 $\mu$m. Further, the second legs 51 and 56 are also separated from each other by a distance of approximately 13 $\mu$m. In the embodiment shown in FIG. 3, the square shaped bonding pad 41 has a first area, the first L-shaped bonding pad 42 has a second area, the second area larger than the first area, and the second L-shaped bonding pad 43 has a third area, the third area larger than the second area. In other words, bonding pads 41, 42, and 43 formed in bonding pad region 14 have different sizes. It shall be understood that the dimensions for the bonding pad region 14 and the bonding pads 41, 42, and 43 are merely provided as examples and are not a limitation of the present invention.

As discussed supra, each bonding pad region 14, 15, 16, and 17 has one square shaped bonding pad and two substantially L-shaped bonding pads. Accordingly, each bonding pad region 15, 16, and 17 has a square shaped bonding pad 61, 71, and 81, respectively, and two L-shaped bonding pads 62 and 63, 72 and 73, and 82 and 83, respectively. It shall be understood that the description of the bonding pad regions 15, 16, and 17 and their respective bonding pads 61–63, 71–73, and 81–83, follows from the description of the bonding pad region 14. Briefly stated, the second square shaped bonding pad 61 is formed from the corner 35 of the bonding pad region 15, a third L-shaped bonding pad 62 is formed adjacent to the second square shaped bonding pad 61, and a fourth L-shaped bonding pad 63 is formed adjacent to the second square shaped bonding pad 62. The second L-shaped bonding pad 62 is between the second square shaped bonding pad 61 and the second L-shaped bonding pad 63.

Similarly, the third square shaped bonding pad 71 is formed from the corner 39 of the bonding pad region 16, a fifth L-shaped bonding pad 72 is formed adjacent to the third square shaped bonding pad 71, and a sixth L-shaped bonding pad 73 is formed adjacent to the fifth L-shaped bonding pad 72. The second L-shaped bonding pad 72 is between the third square shaped bonding pad 71 and the sixth L-shaped bonding pad 73. The fourth square shaped bonding pad 81 is formed in the corner 49 of the bonding pad region 17, and a seventh L-shaped bonding pad 82 is formed adjacent to the fourth square shaped bonding pad 81. An eighth L-shaped bonding pad 83 is formed adjacent to the seventh L-shaped bonding pad 82, such that the seventh L-shaped bonding pad 82 is between the fourth square shaped bonding pad 81 and the eighth L-shaped bonding pad 83. Methods of patterning layers of conductive material to form bonding pad regions and bonding pads are well known to those skilled in the art.

Figure 4:
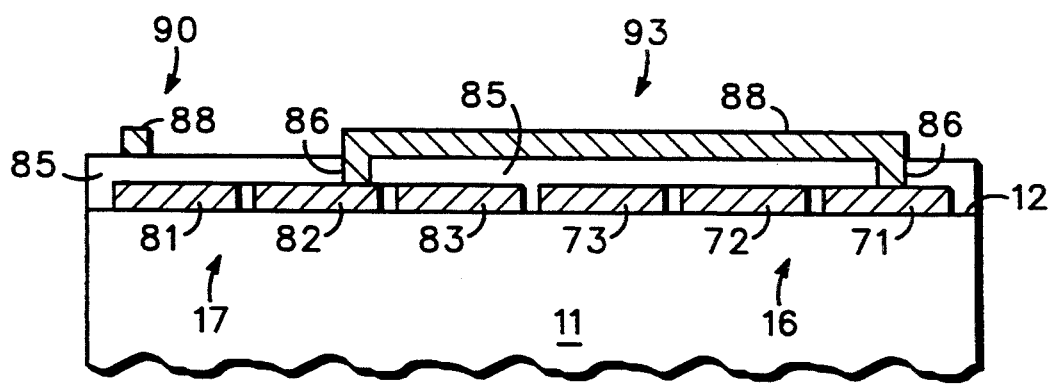
FIG. 4 illustrates a highly enlarged cross-sectional view of a test card along section line 4—4 of FIG. 5 in accordance with the first embodiment of the present invention.
Figure 5:
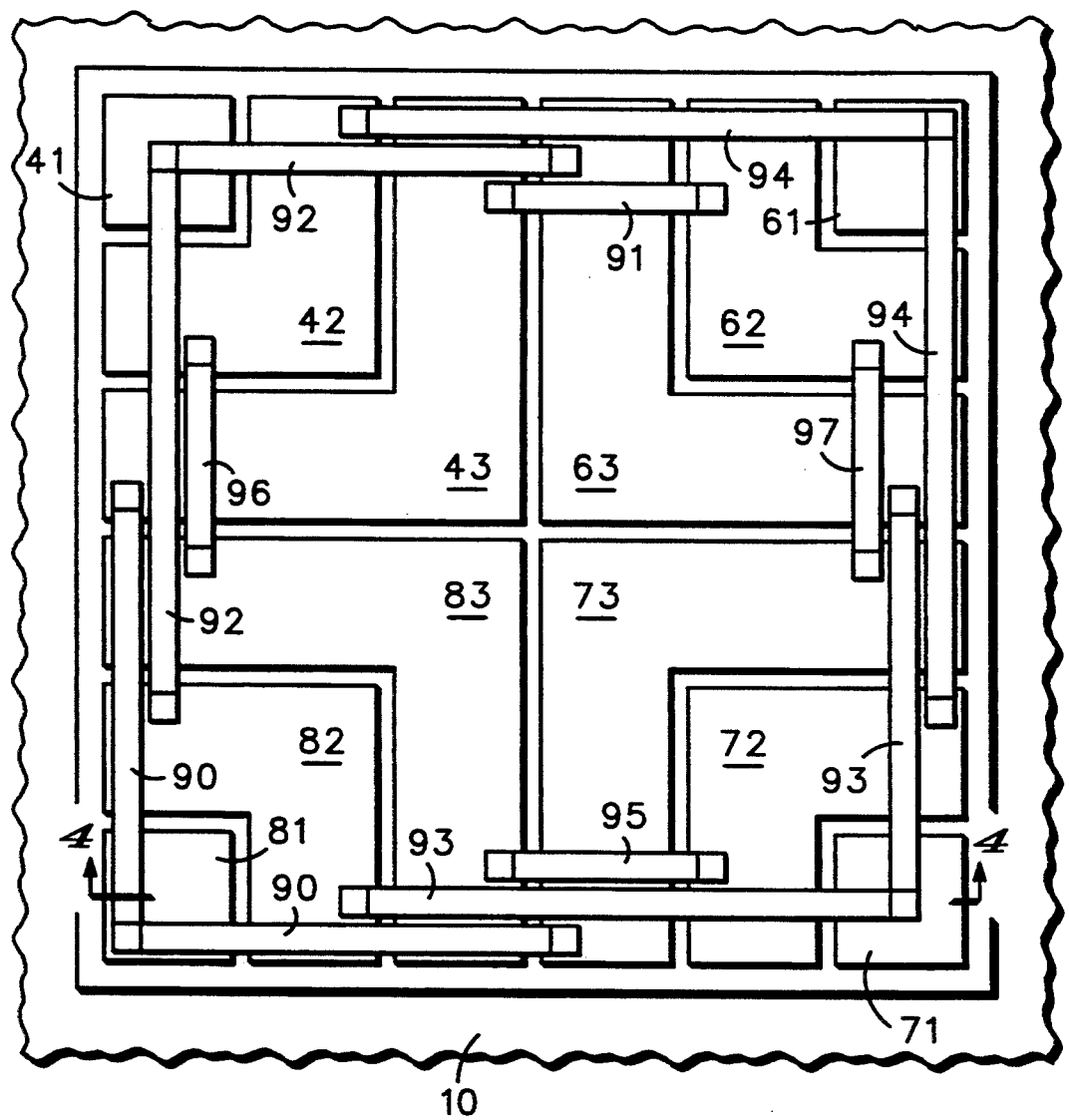
FIG. 5 illustrates a plan view of the test card of FIG. 4 having a layer of conductive material patterned thereon.

FIG. 4 illustrates a highly enlarged cross-sectional view of the test card 10 along section line 4—4 of FIG. 5. A layer of dielectric material 85 is formed on bonding pads 41–43, 61–63, 71–73, and 81–83 and on the exposed portions of major surface 12. Subsequently, a plurality of vias 86 are formed in the layer of dielectric material 85 to expose portions of the bonding pads 61, 62, 63, 71, 72, 73, 81, 82, and 83. In particular, FIG. 4 illustrates a cross-sectional view of the bonding pads 71, 72, 73, 81, 82, and 83, and the vias 86 exposing a portion of the third square shaped bonding pad 71 and the seventh L-shaped bonding pad 82. Methods and materials of forming layers of dielectric material and subsequently patterning and forming vias therethrough are well known to those skilled in the art. By way of example, the layer of dielectric material 85 is silicon dioxide having a thickness of approximately 5,000 angstroms.

A layer of conductive material 88 is formed over the layer of dielectric material 85, thereby filling the plurality of vias 86. The layer of conductive material 88 is patterned to form electrical interconnects or conductive traces between the bonding pads. A portion of electrical interconnects 90 and 93 are shown in FIG. 4. The conductive traces 90 and 93 are further discussed with reference to FIG. 5. Although FIG. 4 is a cross-sectional view along section line 4—4 of FIG. 5, only portions of conductive traces 90 and 93 have been shown to facilitate an understanding of the present invention. It shall be understood that the layer of conductive material 88 is patterned to form electrical interconnects between selected bonding pads 41, 42, 43, 61, 62, 63, 71, 72, 73, 81, 82, and 83 as illustrated in FIG. 5. Techniques and conductive materials for forming electrical interconnects are well know to those skilled in the art. By way of example, the layer of conductive material 88 is gold, which is patterned using photolithographic techniques followed by application of a standard etch technique.

FIG. 5 illustrates a plan view of a portion of the test card 10 having the layer of conductive material (reference numeral 88 of FIG. 4) patterned thereon. More particularly, a first conductive trace 90 electrically connects the bonding pads 43, 73, and 81 together. A second conductive trace 91 electrically connects the bonding pad 43 with the bonding pad 62. A third conductive trace 92 electrically connects the bonding pads 41, 63, and 82 together. A fourth conductive trace 93 electrically connects the bonding pads 63, 71, and 82 together. A fifth conductive trace 94 electrically connects the bonding pads 42, 61, and 72 together. A sixth conductive trace 95 electrically connects the bonding pads 72 and 83 together, and a seventh conductive trace 96 electrically connects the bonding pads 42 and 83 together. An eighth conductive trace 97 electrically connects the bonding pads 62 and 73 together. Thus, the bonding pads 41, 61, 71, and 81 are interconnected, the bonding pads 42, 62, 72, and 82 are interconnected, and the bonding pads 43, 63, 73, and 83 are interconnected.

Figure 6:
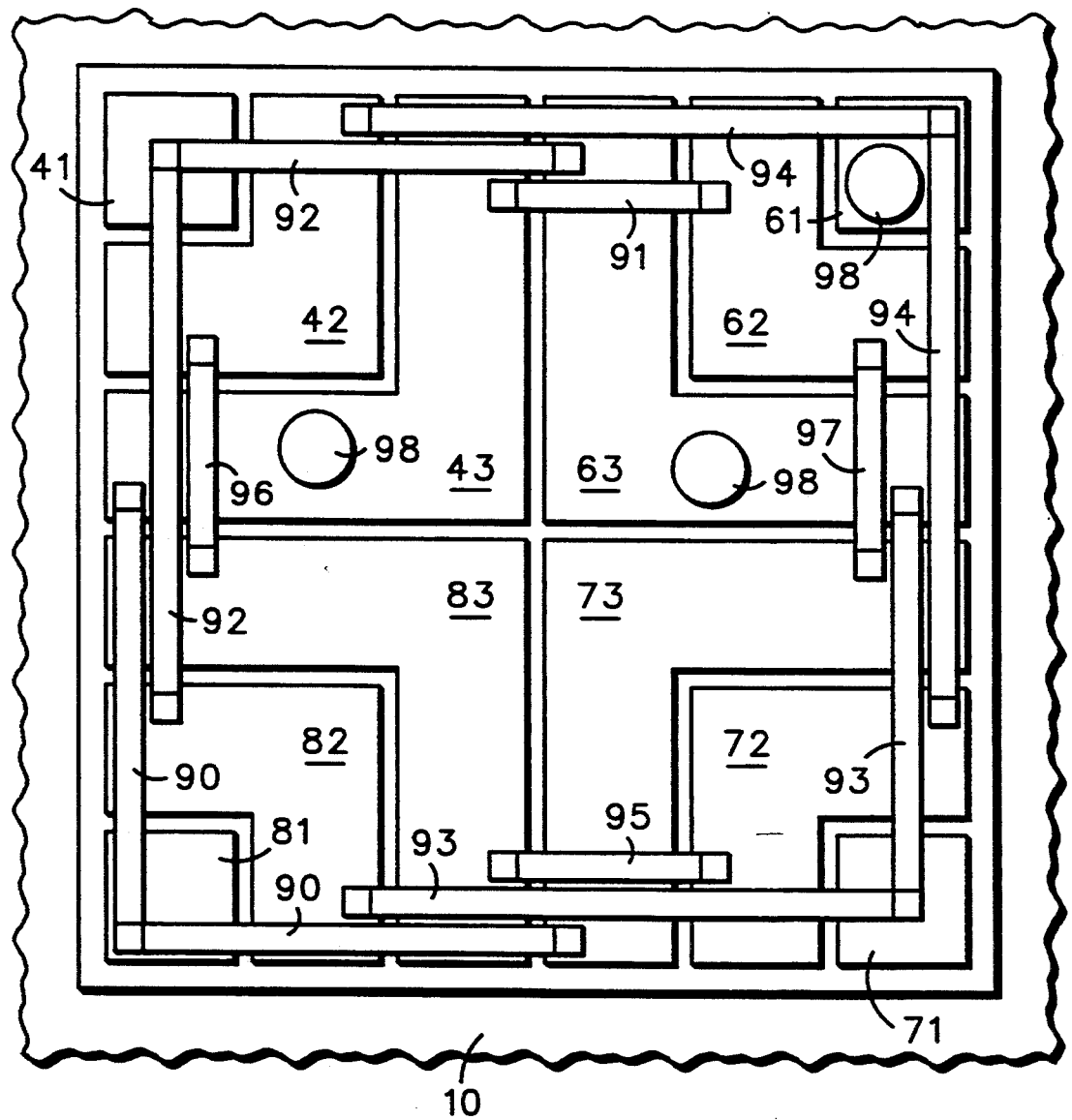
FIG. 6 illustrates a plan view of the test card of FIG. 5 having a plurality of bumps formed thereon.

FIG. 6 illustrates a plan view of the test card 10 having bumps 98 formed on the bonding pads 43, 61, and 63. Materials and methods of forming bumps on bonding pads are well known to those skilled in the art. Suitable materials for the bumps are gold, solder, or the like. Although bumps are only shown on bonding pads 43, 61, and 63, it shall be understood that bumps may be formed on bonding pads 41, 42, 43, 61, 62, 63, 71, 72, 73, 81, 82, and 83.

Figure 7:
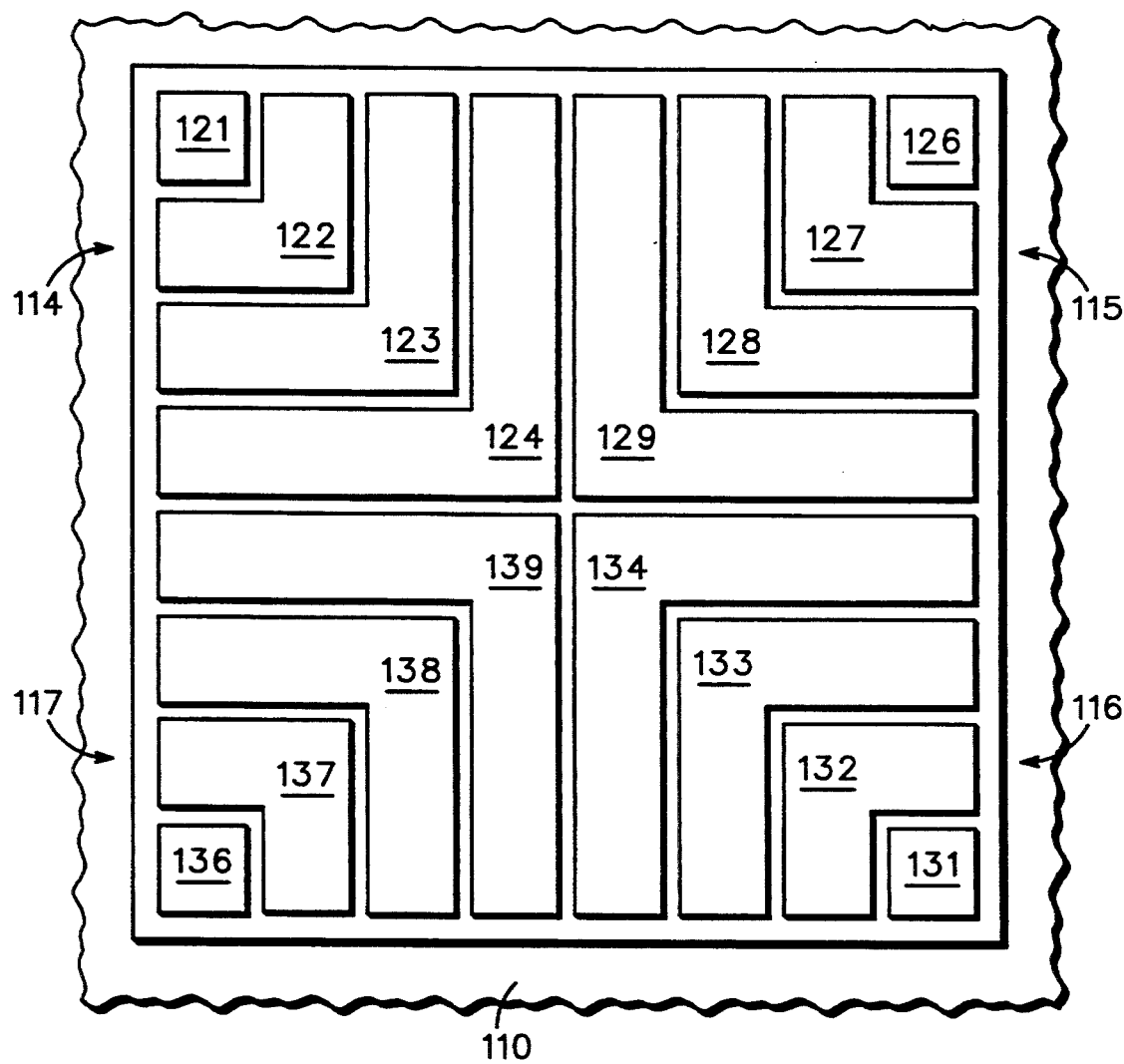
FIG. 7 illustrates a plan view of a test card in accordance with a second embodiment of the present invention.

FIG. 7 illustrates a plan view of a second embodiment of a test card 110. In the second embodiment, the test card 110 has four bonding pad regions 114, 115, 116, and 117, similar to the test card 10. However, each bonding pad region 114, 115, 116, and 117 has four bonding pads. More particularly, bonding pad region 114 has a square shaped bonding pad 121, and three L-shaped bonding pad regions 122, 123, and 124; bonding pad region 115 has a square shaped bonding pad 126 and three L-shaped bonding pads 127, 128, and 129; bonding pad region 116 has a square shaped bonding pad 131, and three L-shaped bonding pads 132, 133, and 134; and bonding pad region 117 has a square shaped bonding pad 136, and three L-shaped bonding pads 137, 138, and 139. In the embodiment shown in FIG. 8, the square shaped bonding pads 121, 126, 131, 136, have a first area; the L-shaped bonding pads 122, 127, 132, and 137 have a second area, the second area larger than the first area; the L-shaped bonding pads 123, 128, 133, 138 have a third area, the third area larger than the second area; and the L-shaped bonding pads 124, 129, 134, and 139 have a fourth area, the fourth area larger than the third area.

Figure 8:
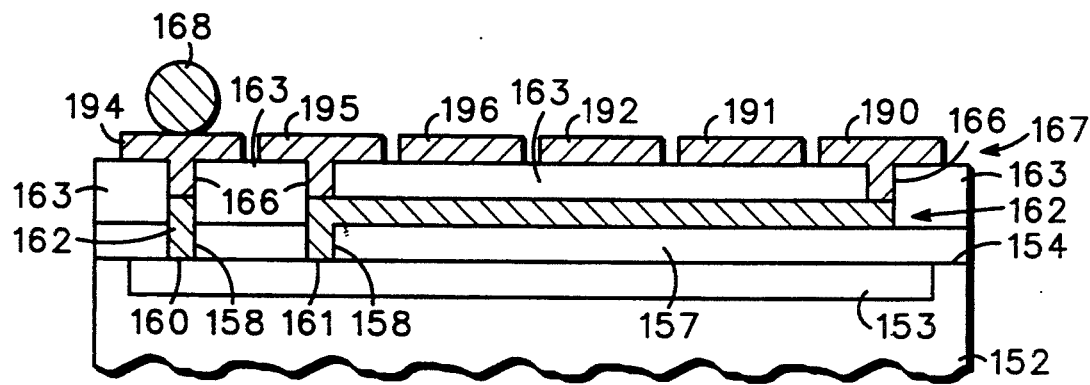
FIG. 8 illustrates a cross-sectional view of a portion of a semiconductor die having a plurality of bonding pads taken along section line 8—8 of FIG. 9 in accordance with a third embodiment of the present invention.
Figure 9:
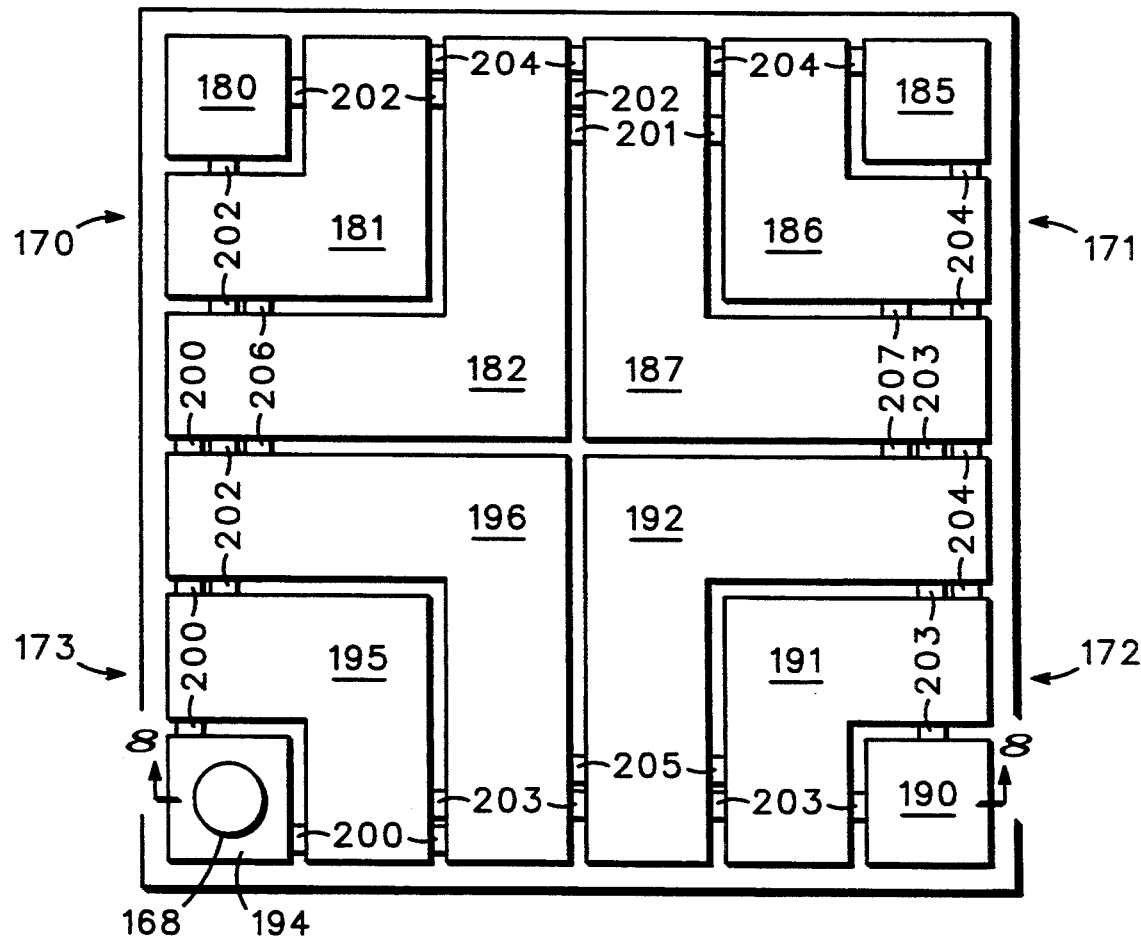
FIG. 9 illustrates a plan view of the semiconductor die of FIG. 8.

FIG. 8 illustrates a cross-sectional view of a portion of a semiconductor die 150 taken along section line 8—8 of FIG. 9, and having a plurality of bonding pads 190–192 and 194–196 in accordance with the present invention. It shall be understood that additional bonding pads 180–182 and 185–187 are present on the semiconductor die 150 and shown in FIG. 9. The semiconductor die 150 comprises a semiconductor substrate 152 in which a semiconductor device 153 is fabricated. The semiconductor substrate has a major surface 154. Suitable materials for the semiconductor substrate 152 include gallium arsenide, silicon, germanium, indium phosphide, or the like. It shall be understood that the semiconductor device 153 is represented by a rectangle and may include elements such as transistors, diodes, resistors, etc. The type of semiconductor device 153 is not a limitation of the present invention. By way of example, the semiconductor substrate 152 is gallium arsenide and the semiconductor device 153 is a diode-resistor network. The diode-resistor network is fabricated using techniques well known to those skilled in the art.

A layer of dielectric material 157 is formed on the major surface 154. Suitable materials for the layer of dielectric material include oxides, nitrides, polyimide, or the like. The layer of dielectric material 157 is patterned such that a plurality of vias 158 are formed therethrough, thereby exposing first and second portions 160 and 161, respectively, of the major surface 154. The portions 160 and 161 serve as contact regions for the semiconductor device 153. As those skilled in the art are aware, the locations for the plurality of vias 158 is set in accordance with the locations of the terminals (not shown) of the semiconductor device 153, and thus are predetermined by the aforementioned locations. In the diode-resistor network example, the locations of the plurality of vias 158 is selected in accordance with the location of the terminals of the diode-resistor network, i.e., the anode and cathode of the diode, and the terminals of the resistor. Methods of patterning a layer of dielectric material are well known to those skilled in the art.

A layer of conductive material 162 is formed on the layer of dielectric material 157. The layer of conductive material 162 fills the plurality of vias 158 and forms contacts in the contact regions 160 and 161. Subsequently, the layer of conductive material 162 is patterned using techniques well known to those skilled in the art. As is obvious to those skilled in the art, the pattern of the layer of conductive material 162 is selected in accordance with the desired interconnect scheme of the plurality of bonding pads 180–182, 185–187, 190–192, and 194–196; thus the pattern of the desired interconnect scheme is predetermined. The patterned layer of conductive material 162 forms electrical interconnects between the bonding pads 180–182, 185–187, 190–192, and 194–196. The shape of the bonding pads is further described with reference to FIG. 9.

A layer of dielectric material 163 is formed on the patterned layer of conductive material 162. The layer of dielectric material 163 is patterned to form a plurality of vias 166, which expose portions of the patterned layer of conductive material 162. More particularly, FIG. 8 illustrates that the plurality of vias 166 expose portions of the interconnects 200 and 203 of FIG. 9.

A layer of conductive material 167 is formed on the layer of dielectric material 163. The layer of conductive material 167 fills the plurality of vias 166 and contacts portions of the patterned layer of conductive material 162. The layer of conductive material 167 is patterned using photolithographic techniques to form bonding pad regions 170–173 having the plurality of bonding pads 180–182, 185–187, 190–192, and 194–196, respectively (shown in FIG. 9). Suitable materials for the layer of conductive material 167 include gold, aluminum, titanium-tungsten, or the like.

One or more optional bumps 168 may be formed on the bonding pads 180–182, 185–187, 190–192, and 194–196. Those skilled in the art will understand that the number and positioning of the bumps is in accordance with a bonding pad pattern on a test interface structure (not shown) such as a test card. In the example illustrated in FIG. 8, an optional bump 168 is formed on the bonding pad 194. Methods and materials for forming bumps are well known to those skilled in the art.

FIG. 9 illustrates a plan view of a portion of the semiconductor die 150 having the layer of conductive material 167 patterned to form four bonding pad regions 170, 171, 172, and 173, each bonding pad region having bonding pads 180–182, 185–187, 190–192, and 194–196, respectively. Similar to the first embodiment illustrated in FIG. 5, each bonding pad region has a square shaped bonding pad and two L-shaped bonding pads. In particular, bonding pad region 170 has a square shaped bonding pad 180, and two L-shaped bonding pad regions 181 and 182; bonding pad region 171 has a square shaped bonding pad 185 and two L-shaped bonding pads 186 and 187; bonding pad region 172 has a square shaped bonding pad 190, and two L-shaped bonding pads 191 and 192; and the bonding pad region 173 has a square shaped bonding pad 194, and two L-shaped bonding pads 195 and 196. In the embodiment shown in FIG. 9, the square shaped bonding pads 180, 185, 190, 194, have a first area; the L-shaped bonding pads 181, 186, 191, and 195 have a second area, the second area larger than the first area; and the L-shaped bonding pads 182, 187, 192, and 196 have a third area, the third area larger than the second area.

Further, a first conductive trace 200 electrically connects the bonding pads 182, 192, and 194 together. A second conductive trace 201 electrically connects the bonding pad 182 with the bonding pad 186. A third conductive trace 202 electrically connects the bonding pads 180, 187, and 195 together. A fourth conductive trace 203 electrically connects the bonding pads 187, 190, and 195 together. A fifth conductive trace 204 electrically connects the bonding pads 181, 185, and 191 together. A sixth conductive trace 205 electrically connects the bonding pads 191 and 196 together, and a seventh conductive trace 206 electrically connects the bonding pads 181 and 196 together. An eighth conductive trace 207 electrically connects the bonding pads 186 and 192 together. It shall be understood that the conductive traces 200–207 are beneath the bonding pads 180–182, 185–186, 190–192, and 194–196; however, in the embodiment of FIGS. 8 and 9, the pattern of the conductive traces 200–207 is similar to that of conductive traces 90–97 shown in FIG. 5. Conductive traces are also referred to as electrical interconnects.

By now it should be appreciated that new and novel bonding pads and a method of forming the bonding pads has been provided. As those skilled in the art are well aware, the bonding pads on semiconductor devices may be in one configuration for one type of semiconductor device and in a different configuration for another type of semiconductor device. Thus, testing different types of semiconductor devices has required making new test cards having precisely positioned bonding pads formed thereon, and forming bumps on the bonding pads.

In one embodiment of the present invention, a single set of test cards is manufactured having the new and novel bonding pads formed thereon. Bumps are formed on the bonding pads, wherein the bumps are patterned to mate with the bonding pads on a semiconductor device. Thus, the bumps can be formed in a plurality of configurations on the test cards having the new bonding pad configuration. Accordingly, the present invention enables the use of a single bonding pad pattern on a test card for testing different semiconductor device types having the same or different bonding pad patterns.

In another embodiment of the present invention, the new and novel bonding pads are formed on the semiconductor substrate in which the semiconductor device is formed. The same bonding pad pattern can be used for different semiconductor devices by interconnecting the bonding pads with the appropriate contacts. Thus, a single set of test cards can be used to test different semiconductor devices. Accordingly the use of either embodiment results in a savings in the costs associated with manufacturing test cards. Other modifications and variations of the bonding pad configuration will be apparent to those skilled in the art, such as forming the bonding pads with shapes other than those described; it is intended to encompass all such variations and modifications within the broad scope of the invention.

I claim:

1. A method of manufacturing a bonding pad structure, comprising the steps of:
   providing a substrate having a major surface;
   forming a plurality of bonding pad regions on the major surface; and
   forming a plurality of bonding pads in each of the plurality of bonding pad regions, wherein each bonding pad of the plurality of bonding pads in one of the plurality of bonding pad regions has a different size, and at least one of the plurality of bonding pads in a first of the plurality of bonding pad regions is coupled to at least one of the plurality of bonding pads in a second of the plurality of bonding pad regions and to at least one of the plurality of bonding pads in a third of the plurality of bonding pad regions.

2. A method of manufacturing a bonding pad structure as claimed in claim 1, wherein the step of forming a plurality of bonding pad regions comprises:

forming a layer of conductive material on the major surface; and patterning the layer of conductive material to have four electrically isolated regions, each of the four electrically isolated regions having at least two bonding pads, the at least two bonding pads of different sizes.

3. A method of manufacturing a bonding pad structure as claimed in claim 1, wherein the step of forming a plurality of bonding pad regions comprises:

forming a first layer of dielectric material on the first major surface;

forming at least one via through the first layer of dielectric material, the at least one via positioned to expose a portion of the substrate;

forming a patterned first layer of conductive material on the first layer of dielectric material, the patterned first layer of conductive material filling the at least one via;

forming a second layer of dielectric material on the first layer of conductive material;

forming at least one via through the second layer of dielectric material, the at least one via positioned to expose a portion of the first layer of conductive material; and forming a second layer of conductive material, the second layer of conductive material filling the at least one via through the second layer of dielectric material.

4. A method of manufacturing a bonding pad structure as claimed in claim 1, further including forming the substrate from a semiconductor material.

5. A method of manufacturing a bonding pad structure comprising the steps of:

providing a substrate having a major surface;

forming a plurality of bonding pad regions on the major surface; and forming at least three bonding pads in each bonding pad region, wherein one of the at least three bonding pads has a square shape and two of the at least three bonding pads have L-shapes, and wherein at least one of the plurality of bonding pads in a first of the plurality of bonding pad regions is coupled to at least one of the plurality of bonding pads in a second of the plurality of bonding pad regions and to at least one of the plurality of bonding pads in a third of the plurality of bonding pad regions.

6. A method of manufacturing a bonding pad structure as claimed in claim 5, further including forming the square shaped bonding pad of a first area, one of the L-shaped bonding pads of a second area, and another of the L-shaped bonding pads of a third area, wherein the first area is smaller than the second area, and the second area is smaller than the third area.

7. A method of manufacturing a bonding pad structure as claimed in claim 1, wherein the steps of forming a plurality of bonding pad regions and forming a plurality of bonding pads in each of the plurality of bonding pad regions are performed simultaneously.

8. A method of forming bonding pads, comprising the steps of:

providing a substrate having a major surface;

forming a plurality of bonding pad regions;

forming a plurality of bonding pads in each of the plurality of bonding pad regions;

interconnecting at least one of the plurality of bonding pads to at least two of the plurality of bonding pads; and forming bumps on selected bonding pads.

9. A method of forming bonding pads as claimed in claim 8, further including forming four bonding pad regions, each bonding pad region having three bonding pads located therein.

* * * * *